US006980136B2

(12) United States Patent
Tsai et al.

(10) Patent No.: US 6,980,136 B2
(45) Date of Patent: Dec. 27, 2005

(54) KEYBOARD WITH DETECTION FUNCTION FOR PRESSING PRESSURE

(75) Inventors: Yu-Wei Tsai, Hsin-Chu (TW); Yi-Feng Jang, Hsin-Chu (TW)

(73) Assignee: Weltrend Semiconductor, Inc., (TW)

( * ) Notice: Subject to any disclaimer, the term of this patent is extended or adjusted under 35 U.S.C. 154(b) by 0 days.

(21) Appl. No.: 10/891,764

(22) Filed: Jul. 14, 2004

(65) Prior Publication Data

US 2005/0104751 A1 May 19, 2005

(30) Foreign Application Priority Data

Nov. 17, 2003 (TW) .............................. 92132096 A

(51) Int. Cl.[7] .............................................. H03M 11/00

(52) U.S. Cl. .......................... 341/27; 341/34; 345/168; 84/719

(58) Field of Search .............................. 341/27, 20, 22, 341/34; 345/168; 84/719

(56) References Cited

U.S. PATENT DOCUMENTS

| | | | | |
|---|---|---|---|---|
| 4,334,280 | A * | 6/1982 | McDonald | 708/136 |
| 4,415,283 | A * | 11/1983 | Smith | 400/94 |
| 4,899,631 | A * | 2/1990 | Baker | 84/719 |
| 5,212,473 | A * | 5/1993 | Louis | 345/168 |
| 5,982,304 | A * | 11/1999 | Selker et al. | 341/27 |
| 6,002,184 | A * | 12/1999 | Delson et al. | 310/14 |
| 6,059,506 | A * | 5/2000 | Kramer | 414/5 |
| 6,061,004 | A * | 5/2000 | Rosenberg | 341/20 |
| 6,218,966 | B1 * | 4/2001 | Goodwin et al. | 341/27 |
| 6,509,847 | B1 * | 1/2003 | Anderson | 341/34 |

* cited by examiner

*Primary Examiner*—Albert K. Wong
(74) *Attorney, Agent, or Firm*—Anthony R. Barkume, P.C.

(57) ABSTRACT

The present invention provides a kind of computer keyboard being able to detect the pressing pressure of keys. The computer keyboard comprises: a plurality of keys; a detecting unit, which outputs a detecting signal according to the pressing pressure of the plurality of keys; and a keyboard controller, which generates a key code according to the detecting signal and sends the key code to a digital device.

13 Claims, 6 Drawing Sheets

KEYBOARD WITH DETECTION FUNCTION FOR PRESSING PRESSURE

FIELD OF THE INVENTION

The present invention relates to a computer keyboard, and more particularly relates to a computer keyboard with the multiple functions to detect the key pressure and shaking effect and prompt message.

BACKGROUND OF THE INVENTION

The computer keyboard is the most popular input device for general computer users. It is needful especially for reporters, accountants, and typists those who need to type lots of numbers or words.

However, the prior keyboards can only provide users a simplex and prosy function, even though some other products that accentuate user-friendly design could only provide some function keys to allow users being able to activate pre-defined commands quickly. These user-friendly design keyboards may be helpful to enhance operating performance, but they still lack of the interactive effect.

For the working peoples, the competition pressure is very heavy and the working time is very long, lots of workers spend most of their time in the offices, face to the computers, work hard, but with less relax opportunity. Sometimes these workers need to take a relax but cannot leave away, if they can have interactive entertainments that are provided by office devices, such as computers, mouse, or keyboards, then they would be able to release their nervousness and impatience. But, the design for entertainment of current computer peripherals such as keyboards, is not enough. So, how to enhance the computer keyboard's functions for entertainment is a main topic of the present invention.

SUMMARY OF THE INVENTION

The objective of the invention is to create a computer keyboard with multiple functions. By adding an analog to digital converter (ADC) onto the computer keyboard to detect the pressing pressure onto a key, users are able to run a simple application to play as a keyboard instrument and create some music such as a piano. Moreover, a pulse width modulator (PWM) and an actuator are introduced to make computer keyboards be able to shake, and then we may get a great entertainment effect after combining with some applications.

Another objective of this invention is to create a computer keyboard that is equipped with display devices such as LEDs to change the status of display devices on the keyboards whenever the connected computers receive e-mails, or to shake the computer keyboards by the shaking device to inform users for receiving new information.

By integrating above key pressing detecting, shaking effect, and electrical information noticing, we may give the computer keyboards more and more functions and applications to give users more and more multiple and interactive functions by keyboards.

According to the present invention, a kind of computer keyboard being able to detect the pressing pressure of keys. The computer keyboard comprises:

A plurality of keys;

A detecting unit for outputting a detecting signal according to the pressing pressure of the plurality of keys; and A keyboard controller for generating a key code according to the detecting signal and sends the key code to a digital device.

In accordance with one aspect of the present invention, the digital device could be a personal computer (PC), a notebook, or a PDA (Personal Digital Assistant).

In accordance with one aspect of the present invention, the detecting unit comprises a transfer unit to transfer the pressing pressure on the plurality of keys to an analog signal.

In accordance with one aspect of the present invention, the detecting unit further more comprises an analog to digital converter (ADC) to convert the analog signal to the detecting signal for output.

In accordance with one aspect of the present invention, the detecting unit can be integrated in the keyboard controller.

According to the present invention, a computer keyboard with shaking effect and being able to connect with a digital device comprises a shaking device to drive the computer keyboard shaking according to a command.

In accordance with one aspect of the present invention, the digital device could be a personal computer (PC), a notebook, or a PDA (Personal Digital Assistant).

In accordance with one aspect of the present invention, the computer keyboard further more comprises a keyboard controller to send the command from the digital devices or the computer keyboard to the shaking device.

In accordance with one aspect of the present invention, the shaking device comprises a pulse width modulator (PWM) and an actuator, and the pulse width modulator is able to receive the command and to drive the actuator for generating shaking effect.

In accordance with one aspect of the present invention, the command is a voltage level, and the pulse width modulator is able to enhance or reduce the shaking effect that generated by the actuator according to the voltage level.

In accordance with one aspect of the present invention, the pulse width modulator can be integrated into the keyboard controller.

According to the present invention, a computer keyboard with message notice function and being able to connect with a digital device comprises a responding unit for generating a responding action according to the digital device receiving a message.

In accordance with one aspect of the present invention, the digital device could be a personal computer (PC), a notebook, or a PDA (Personal Digital Assistant).

In accordance with one aspect of the present invention, the message could be an instant message or an Email message.

In accordance with one aspect of the present invention, the computer keyboard further more comprises a keyboard controller to control the responding unit for generating the responding action.

In accordance with one aspect of the present invention, the responding unit is a display device, and the display device is able to respond the receiving message event of the digital device by changing the display status.

In accordance with one aspect of the present invention, the display device could be an LCD display or an LED.

The present invention may best be understood through the following description with reference to the accompanying drawings, in which:

DETAILED DESCRIPTION OF THE PREFERRED EMBODIMENT

Figure 1:
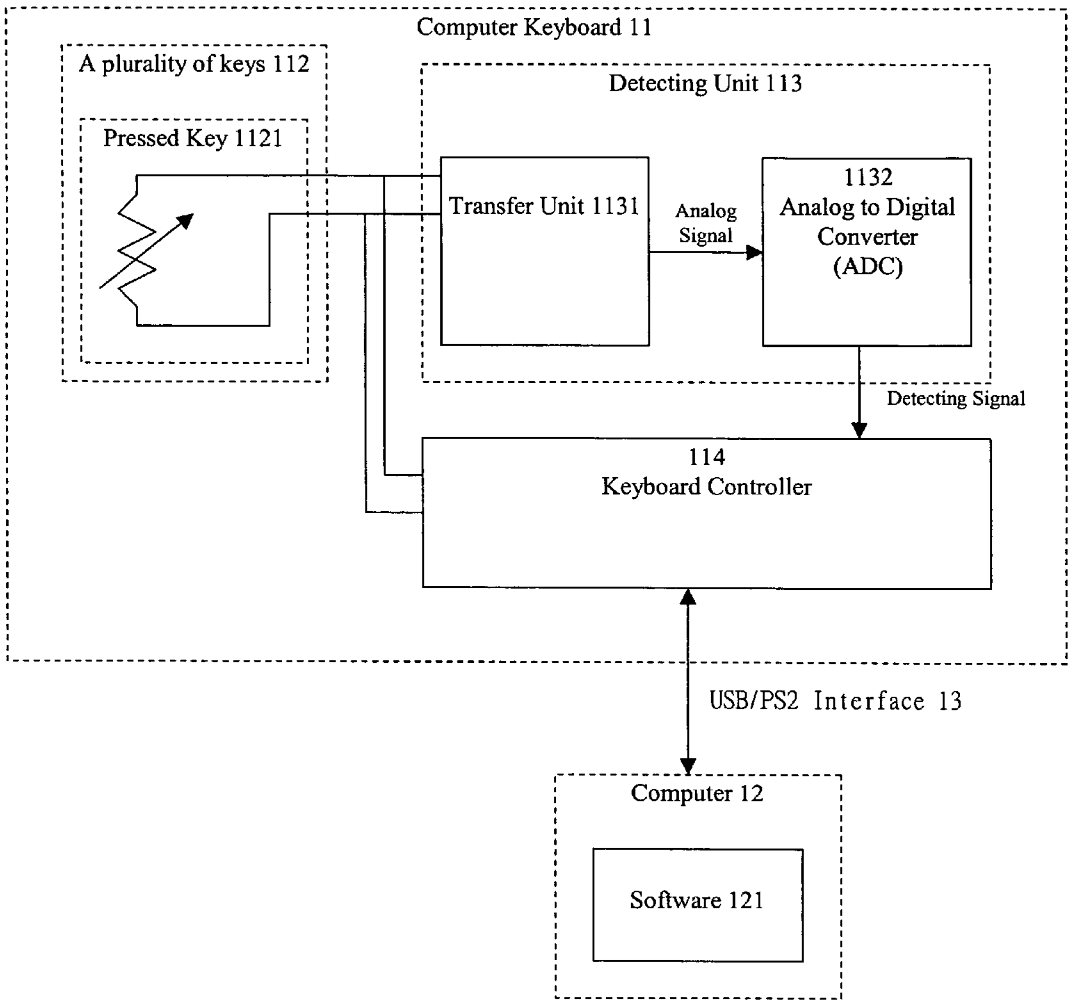
FIG. 1 shows a system block diagram of a computer keyboard that is able to detect the pressing pressure on the keys.

FIG. 1 shows a preferred embodiment according to the present invention. In the figure, the computer keyboard 11 comprises the plurality of keys 112, the detecting unit 113, and the keyboard controller 114, where the detecting unit 113 comprises the transfer unit 1131 and the Analog to Digital Converter (ADC) 1132. The computer keyboard 11 is able to connect and communicate with computer 12 (the digital device) by the keyboard controller 114 through USB/PS2 interface 13.

Whenever any key of the plurality keys 112 is pressed down, the pressed key 1121 can be used as a variable resister and its value reflects the pressing pressure of the pressed key 1121. The resister value of the pressed key 1121 will be transferred to an analog signal by the transfer unit 1131, and be converted to a digital signal by ADC 1132. The keyboard controller generates a key code according to the digital signal, and the key code will be sent to computer 12 via USB/PS2 Interface 13. By means of the information of key's pressing pressure from computer keyboard 11, computer 12 is able to do lots of application by executing software 121, such as:

1. Separating the original keys of the computer keyboard to multiple levels of response to expand the number of keys.
2. Simulating the keyboard typed musical instruments, and being able to adjust the volume, tune, and tempo of music by the pressing pressure of keys.
3. For the game application, game players are able to control the weapon power, car speed, and moving speed of the game roles by the pressing pressure of the keys.

Figure 2:
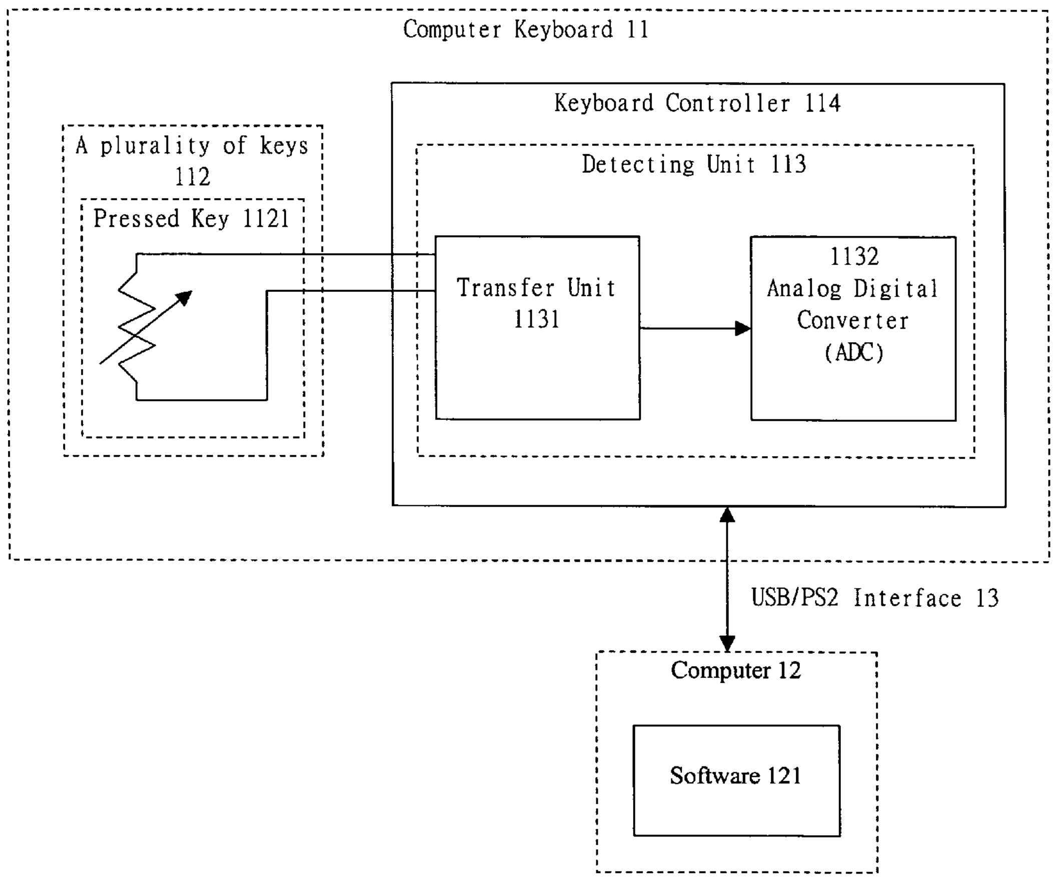
FIG. 2 shows a functional diagram integrating the detecting unit into the keyboard controller.

Further more, detecting unit 113 is able to integrate into the keyboard controller 114 to simplify the complexity of hardware design as shown in FIG. 2.

Figure 3:
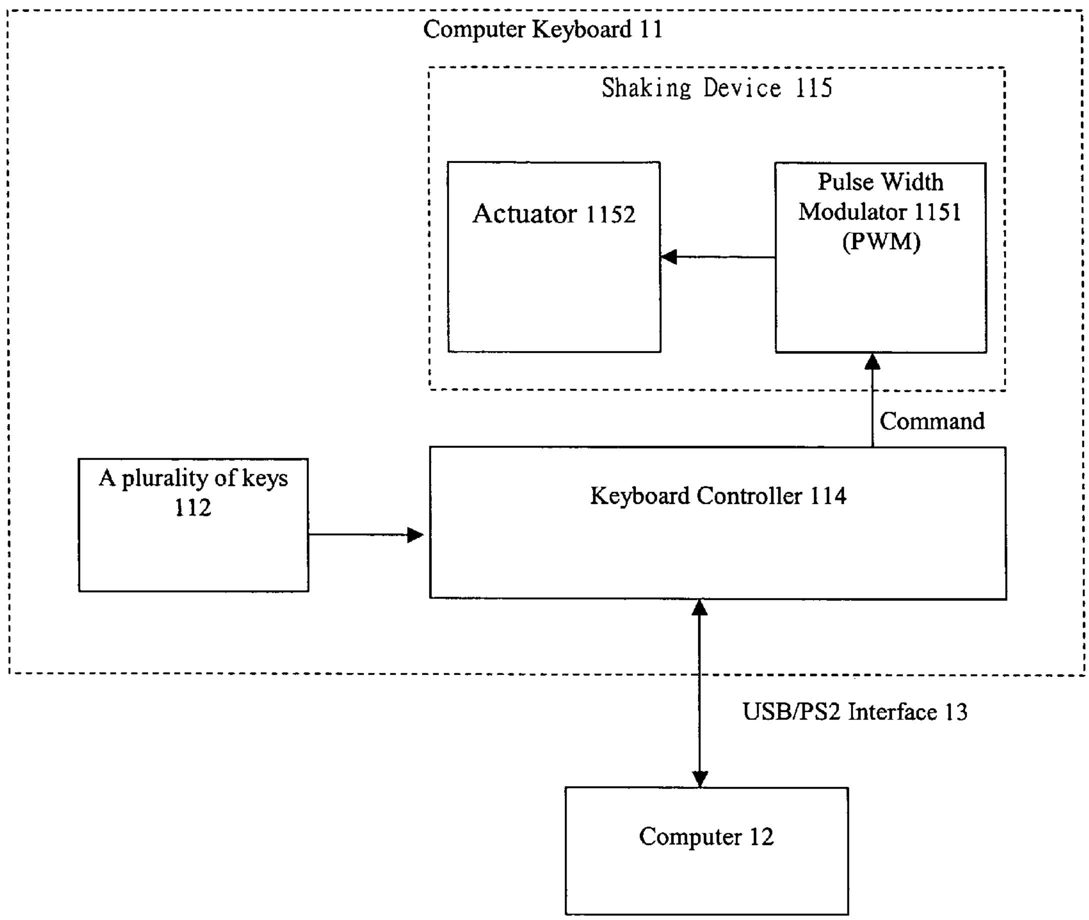
FIG. 3 shows a system block diagram of a computer keyboard with shaking effect.

FIG. 3 shows another preferred embodiment of the present invention. In this figure, the computer keyboard 11 comprises a shaking device 115, the keyboard controller 114, and the plurality of keys 112. In which the shaking device 115 comprises a Pulse Width Modulator (PWM) 1151 and an actuator 1152. When a user presses down any key of the plurality of keys 112, or computer 12 (the digital device) makes a shaking command to inform the keyboard controller 114 via USB/PS2 interface 13, PWM 1151 will ask the computer keyboard 11 for generating pulses to drive the actuator 1152 for shaking effect by reflecting commands. The command to PWM 1141 is a voltage level, which is able to affect the shaking strength of the computer keyboard 11.

Figure 4:
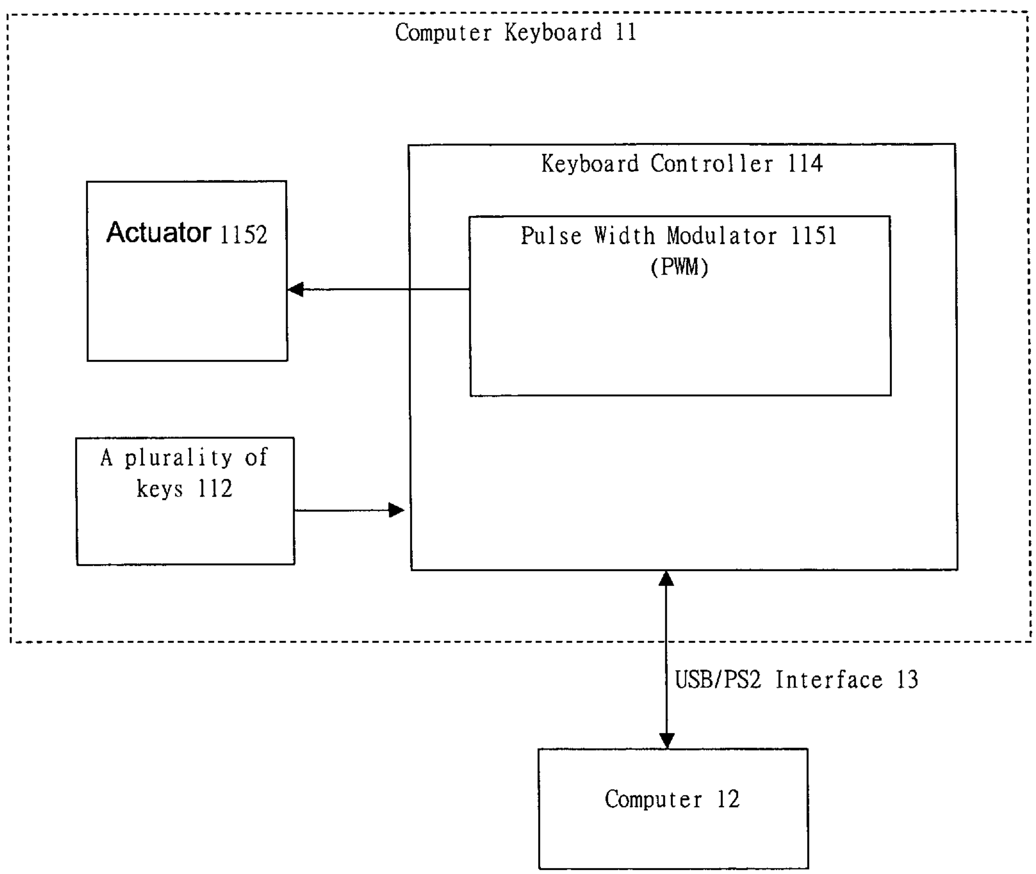
FIG. 4 shows a functional diagram integrating the pulse width modulator into the keyboard controller.

And, PWM 1151 can be integrated into the keyboard controller 114 as shown in FIG. 4, to simplify the complexity of hardware design.

Figure 5:
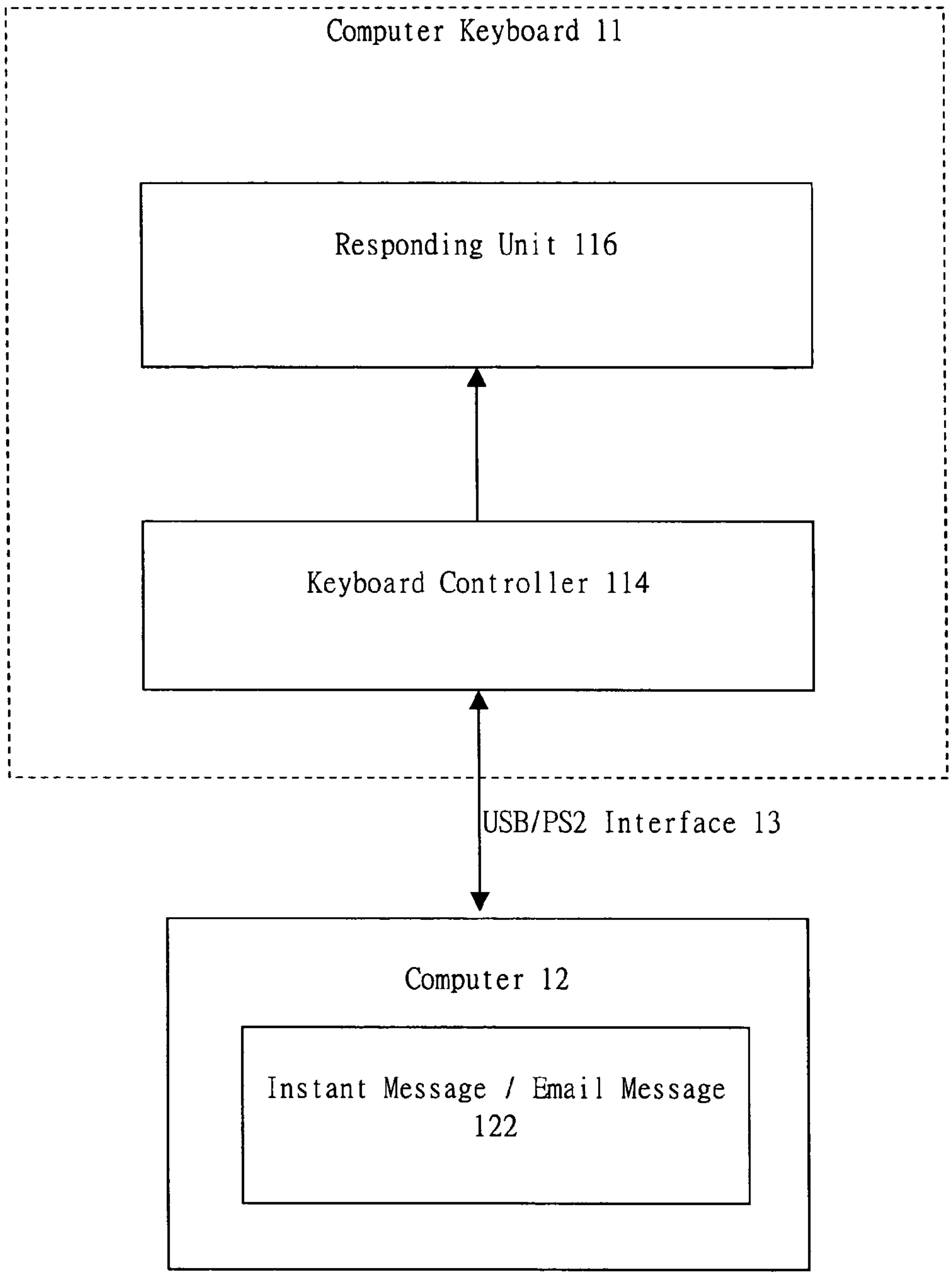
FIG. 5 shows a system block diagram of a computer keyboard with message noticing function.

FIG. 5 shows another preferred embodiment of the present invention. In this figure, the computer keyboard 11 comprises the responding unit 116 and the keyboard controller 114. When computer 12 receives an instant message/email message 122, it can notice the keyboard controller 114 via USB/PS2 interface 13 and activate the responding unit 116 for responding actions to notice users. In which, the responding unit 115 can be an LED or LCD display device to notice users by lighting, flicking, or text displaying.

Figure 6:
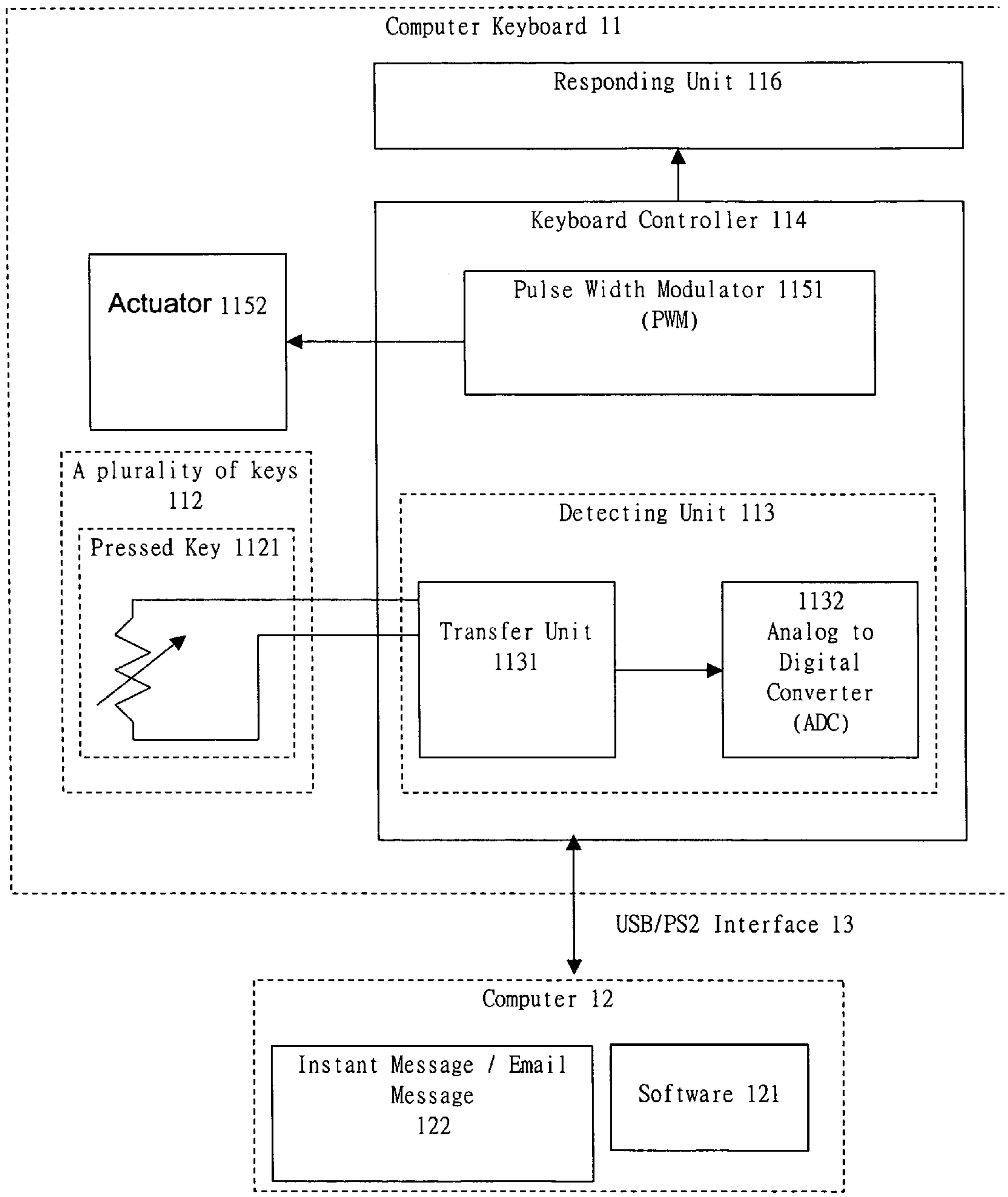
FIG. 6 shows a system block diagram of a computer keyboard that integrates pressing pressure detection of keys, shaking effect, and message noticing functions.

FIG. 6 shows the system block diagram of a computer keyboard that integrates above three functions together. In which, the detecting unit 113 and PWM 1151 are integrated into the keyboard controller 114, and also be separated out as FIG. 1 and FIG. 3. As shown in FIG. 6, the computer keyboard 11 has pressing pressure of keys, shaking effect, and electrical information noticing functions as an interactive keyboard with multiple functions and these functions can support each other. For example, the pressing pressure of keys can provide to software 121 of computer 12 for reference, and also can send commands to PWM 1151 for driving the actuator 1152 to generate shaking effect; further more, for Message noticing, it can notice users by the responding unit 116, and also can notice users by commanding PWM 1151 to drive the actuator 1152 to generate shaking effect.

To sum up, the present invention improves the prior keyboards by providing multiple interactive functions. By adding an ADC (Analog to Digital Converter), a shaking device, and a display device onto the computer keyboard, this keyboard has pressing pressure detection, shaking effect, and electrical information notice functions. And the improvement of technique according to the present invention is, with integrating above pressing pressure detection, shaking effect, and electrical information notice functions, the present invention gives more applications onto a keyboard than a prior one. And combining with suitable computer software will make a computer keyboard not being a simple input device as before, but a wonderful pal in working environment with interactive and entertainment functions.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims that are to be accorded with the broadest interpretation so as to encompass all such modifications and similar structures.

What is claim is:

1. A computer keyboard with the function to detect the pressing pressure of keys, with shaking effect, with message notice function, and being able to connect with a digital device, comprising:

a plurality of keys;

a detecting unit for outputting a detecting signal according to the pressing pressure of said plurality of keys;

a keyboard controller for generating a key code according to said detecting signal and sending said key code to a digital device;

a shaking device to drive said computer keyboard shaking according to a command; and a responding unit to generating a responding action according to said digital device receiving a message.

2. The computer keyboard according to claim 1 wherein said digital device could be a personal computer (PC), a notebook, or a PDA (Personal Digital Assistant).

3. The computer keyboard according to claim 1 wherein said detecting unit comprises a transfer unit to transfer the pressing pressure on said plurality of keys to an analog signal.

4. The computer keyboard according to claim 1 wherein said detecting unit further more comprises an analog to digital converter (ADC) to convert said analog signal to said detecting signal for output.

5. The computer keyboard according to claim 1 wherein said detecting unit being able to be integrated in said keyboard controller.

6. The computer keyboard according to claim 1 wherein said computer keyboard further more comprises a keyboard controller to send said command from said digital devices or said computer keyboard to said shaking device.

7. The computer keyboard according to claim 1 wherein said shaking device comprises a pulse width modulator (PWM) and an actuator, said pulse width modulator is able to receive said command and to drive the actuator for generating shaking effect.

8. The computer keyboard according to claim 1 wherein said command is a voltage level, and said pulse width modulator is able to enhance or reduce the shaking effect that generated by said actuator according to said voltage level.

9. The computer keyboard according to claim 1 wherein said pulse width modulator being able to be integrated into said keyboard controller.

10. The computer keyboard according to claim 1 wherein said message could be an instant message or an Email message.

11. The computer keyboard according to claim 1 wherein said computer keyboard further more comprises a keyboard controller to control said responding unit for generating said responding action.

12. The computer keyboard according to claim 1 wherein said responding unit is a display device, said display device is able to respond said message receiving event of the digital device by changing the display status.

13. The computer keyboard according to claim 1 wherein said display device could be an LCD display or an LED.

* * * * *